United States Patent
Yamaguchi et al.

(10) Patent No.: US 7,903,013 B2
(45) Date of Patent: Mar. 8, 2011

(54) SEMICONDUCTOR DEVICE

(75) Inventors: Kenichiro Yamaguchi, Ome (JP);
Atsushi Okumura, Hamura (JP);
Mitsugu Kusunoki, Kunitachi (JP);
Tomoo Murata, Fussa (JP)

(73) Assignee: Hitachi, Ltd., Tokyo (JP)

( * ) Notice: Subject to any disclaimer, the term of this patent is extended or adjusted under 35 U.S.C. 154(b) by 19 days.

(21) Appl. No.: 12/507,660

(22) Filed: Jul. 22, 2009

(65) Prior Publication Data

US 2010/0072821 A1    Mar. 25, 2010

(30) Foreign Application Priority Data

Sep. 22, 2008  (JP) .................................. 2008-241956

(51) Int. Cl.
*H03M 1/66* (2006.01)
(52) U.S. Cl. ..................... 341/144; 341/136; 341/145
(58) Field of Classification Search .................. 341/136, 341/144, 145
See application file for complete search history.

(56) References Cited

U.S. PATENT DOCUMENTS

| 4,292,625 | A  | * | 9/1981  | Schoeff | 341/145 |
|---|---|---|---|---|---|
| 6,583,744 | B2 | * | 6/2003  | Bright  | 341/145 |
| 7,002,500 | B2 | * | 2/2006  | Li      | 341/144 |
| 7,068,201 | B1 | * | 6/2006  | Chou    | 341/144 |
| 7,312,740 | B2 | * | 12/2007 | Chou    | 341/145 |

FOREIGN PATENT DOCUMENTS

| JP | 02-288420 A | 11/1990 |
|---|---|---|
| JP | 04-217120 A | 8/1992 |

* cited by examiner

*Primary Examiner* — Khai M Nguyen
(74) *Attorney, Agent, or Firm* — Miles & Stockbridge P.C.

(57) ABSTRACT

Operating speed as well as output accuracy of a D-A converter is enhanced. With a semiconductor device including unit current sources, and unit current source switches, plural current source elements constituting each of the unit current sources are disposed so as to be evenly dispersed, thereby reducing errors of the current source element, dependent on distance while the unit current source switches are concentratedly disposed in a small region, thereby mitigating delay in operation, attributable to parasitic capacitance. In addition, with the semiconductor device including R2R resistance ladders, the R2R resistance ladder is provided on the positive and the negative of each of the unit current source switches, and the respective R2R resistance ladders are shorted with each other at respective nodes on a unit current source switch-by-unit current source switch basis, are rendered identical in length, thereby cancelling out a nonlinearity error attributable to wiring parasitic resistance.

14 Claims, 7 Drawing Sheets

SEMICONDUCTOR DEVICE

CLAIM OF PRIORITY

The present application claims priority from Japanese patent application JP 2008-241956 filed on Sep. 22, 2008, the content of which is hereby incorporated by reference into this application.

FIELD OF THE INVENTION

The present invention has an object of enhancing performance of a semiconductor device, and more specifically, the invention relates to a semiconductor integrated circuit with a digital-to-analog converter (D-A converter) mounted therein.

BACKGROUND OF THE INVENTION

Conventional technologies for attaining enhancement in output accuracy of a D-A converter have included, for example, such technologies as described in JP-A Hei2(1990)-288420, and JP-A Hei4(1992)-217120, respectively.

SUMMARY OF THE INVENTION

With a D-A converter semiconductor device, output accuracy and operating speed are major indicators of performance thereof. For a D-A converter required of high-speed operation, use is often made of a current-drive type D-A converter employing current sources. For the current-drive type D-A converter, there are adopted a segmented (current mode) method employing a number of unit current sources, corresponding to input digital data bit numbers, an R2R method whereby respective currents of unit current sources are weighted with an R2R resistance ladder, thereby obtaining current values corresponding to respective bit currents, and a segmented R2R method whereby the segmented method is applied to optional high order bits according to input data bits while the R2R method is applied to remaining low order bits.

With the current-drive type D-A converter, in the case of any of the methods described is adopted, a relative error between the unit current sources, attributable to production tolerance, will have a large effect on output accuracy. For this reason, when high accuracy in addition to high speed is required, it becomes essential to lessen the production tolerance to thereby enhance relative accuracy of the unit current source. Further, with the segmented R2R method as well as the R2R method, employing an R2R resistance ladder circuit, it is necessary to reduce not only the relative error of the unit current source, attributable to the production tolerance but also a weighting error of the unit current source, owing to wiring parasitic resistance of an R2R resistance ladder.

In FIG. 1, there is shown a block diagram of a D-A converter employing a common segmented R2R method as a specific example of the current-drive type D-A converter. The D-A converter employing the segmented R2R method is simply described hereinafter with reference to FIG. 1. Optional high order n bits (n: a natural number not less than 1) among input digital codes are decoded to be inputted as respective control signals of unit current source switches $SS(1)$ to $SS(2^n-1)$ of a segmented section to thereby control respective outputs of $(2^n-1)$ units of unit current sources $SQ(1)$ to $SQ(2^n-1)$. Remaining low order m bits (m: a natural number not less than 1) are inputted to unit current source switches $SR(1)$ to $SR(m)$ of an R2R section to thereby control respective outputs of m pieces of unit current sources $RQ(1)$ to $RQ(m)$ for weighting respective bit currents with the R-2R resistance ladder. Thus, output currents of the unit current sources of the segmented section are combined with output currents of the unit current sources of the R2R section, thereby converting (n+m) bits of digital codes into an analog current. Further, Qref denotes a reference current source for the unit current sources $SQ(1)$ to $SQ(2^n-1)$, and the unit current sources $RQ(1)$ to $RQ(m)$, respectively. A constant current produced by a reference voltage Vref, and a reference resistance Rref is caused to flow to Qref, whereupon a base potential as outputted is fed back to an op-amp to thereby create a reference potential of the unit current source to be fed to $SQ(1)$ to $SQ(2^n-1)$, and $RQ(1)$ to $RQ(m)$, respectively. DAC_OUT means an output terminal.

With respect to a D-A converter of a segmented R2R method, shown in FIG. 2, a configuration is shown in which the unit current sources $SQ(1)$ to $SQ(2^n-1)$, and $RQ(1)$ to $RQ(m)$, shown in FIG. 1, are each composed of plural current source elements that undergo concurrent and parallel operations in parallel numbers L (L: a natural number not less than 2). It is known that if the respective unit current sources are composed of the plural current source elements that undergo concurrent and parallel operations, as shown in FIG. 2, this will enable a relative error between the unit current sources, attributable to production tolerance, to be reduced to thereby enhance output accuracy. If the unit current sources each are composed of L pieces of the current source elements undergoing parallel operations, this will enable a random relative error between the unit current sources to be reduced to $1/\sqrt{L}$.

FIG. 3 is a block diagram showing the R2R section, shown in FIGS. 1 and 2, respectively, in more detail. Respective outputs of the unit current sources $RQ(1)$ to $RQ(m)$ deliver current obtained by weighting respective bit currents with a series of the R2R resistance ladder provided on the positive side of each of the unit current source switches $SR(1)$ to $SR(m)$, connected to an output terminal. Resistances $RL(1)$ to $RL(m)$ each indicate a wiring parasitic resistance between the R2R resistance ladder, and a reference power supply terminal (GND power supply terminal, in FIG. 3). Since voltage drop from the reference power supply terminal, caused by $RL(1)$ to $RL(m)$, respectively, occurs at respective contact points (0) to (m−1) in the figure, a distribution ratio of current of the unit current source, delivered to the reference power supply terminal, to the current delivered to the output terminal, via the R2R resistance ladder, respectively, will not be a fully ideal ratio. Further, depending on output/non-output from each of the unit current sources $RQ(1)$ to $RQ(m)$, that is, depending whether the positive side of each of the unit current source switches $SR(1)$ to $SR(m)$, connected to the output terminal, is turned on, or the negative side thereof, unconnected to the output terminal, is turned on, an amount of the voltage drop from the reference power supply terminal, occurring at the respective contact points (0) to (m−1), will undergo variation, whereupon the distribution ratio of the current will change according to such variation, so that a nonlinearity error will occur to an analog output. $RL(1)$ to $RL(m-1)$ among the wiring parasitic resistances shown in FIG. 2 being generally wiring within the R2R section, $RL(1)$ to $RL(m-1)$ each represent a negligibly minute wiring resistance, however, $RL(m)$ can be a long-distance wiring several mm in length depending on the position of the reference power supply terminal, representing a wiring resistance greater by an order of magnitude as compared with $RL(1)$ to $RL(m-1)$, respectively. For this reason, there can be a case where the amount of the voltage drop caused by $RL(m)$ undergoes variation depending on the output/the non-output from each of the unit current sources $RQ(1)$ to $RQ(m)$, so that a large nonlinearity error occurs to the analog output.

In contrast to FIG. 3, FIG. 4 shows a R2R section that is made up such that variation in the amount of the voltage drop, caused by RL(m), does not occur depending on the output/the non-output from each of the unit current sources RQ(1) to RQ(m). In FIG. 3, the R2R resistance ladder is provided only on the positive side of each of the unit current source switches SR(1) to SR(m), that is, a side thereof, for connection with the output terminal, whereas, in FIG. 4, the R2R resistance ladder is provided on the negative side thereof, as well. Furthermore, wiring for connection with the reference power supply terminal is shared by the R2R resistance ladders provided on the positive side, and the negative side of each of the unit current source switches, respectively, so as to be symmetrical with each other, so that the amount of the voltage drop caused by RL(m) is prevented from undergoing variation depending on the output/the non-output from each of the unit current sources RQ(1) to RQ(m). It is known that if such a configuration is adopted, this will improve linearity of the output of a D-A converter employing the R2R method.

In the case where more accurate output is required of the current-drive type D-A converter, the number of the unit current sources will increase according to bit numbers as required. Further, as described in the foregoing, in the case where the unit current sources are each composed of the plural current source elements undergoing parallel operations in order to reduce the random relative error between the unit current sources, due to production tolerance, an enormous number of the current source elements will inevitably be required, thereby causing a significant increase in an area where the current source elements are to be disposed. It has since been noted that as there will be an increase in the area where the current source elements are to be disposed in such a case, a characteristic error of the current source element, proportional to a distance, will cause deterioration in relative accuracy of the unit current source, so that output accuracy as required cannot be attained.

In addition, since the unit current source switches for controlling the output/the non-output of each of the unit current sources will come to be disposed across a large area, wiring between the output terminal, and each of the unit current source switches will be extended over a long distance. Charging/discharging of wiring capacitance, over the long distance, will cause delay in changeover (switching) operation to be conspicuous.

Still further, as the output accuracy as required becomes higher, so does non-negligible an effect of an error of weighting with the R2R resistance ladder, due to voltage drop attributable to minute wiring parasitic resistance, on output accuracy. More, specifically, it has been noted that a voltage effect, due to RL(1) to RL(m−1) as minute wiring parasitic resistances in FIG. 4, emerges as a nonlinearity error of the output, so that the output accuracy as required cannot be attained. In FIG. 4, since the R2R resistance ladder is provided on the positive side, and the negative side of each of the unit current source switches SR(1) to SR(m), respectively, such that those R2R resistance ladders are symmetrical with each other, and further, the wiring for connection with the reference power supply terminal is shared by the R2R resistance ladder on the positive side and the R2R resistance ladder on the negative side, the amount of the voltage drop caused by the wiring parasitic resistance will not undergo variation depending on the output/the non-output from each of the unit current sources. However, because the wiring extended from the respective contact points (0) to (m−1) where the respective R2R resistance ladders on the positive side and the negative side are shorted with each other to the reference power supply terminal is shared by the respective R2R resistance ladders, the greater a distance from the contact point to the reference power supply terminal is, the larger a wiring resistance at the contact point appears. More specifically, wiring parasitic resistance as seen from the contact point (0) at the farthest distance from the reference power supply terminal is RL(1)+RL(2)+ . . . +RL(m−1)+RL(m) while wiring resistance as seen at the contact point (1) adjacent to the contact point (0) toward the reference power supply terminal is RL(2)+ . . . +RL(m−1)+RL(m). Thus, variation in stages occurs to an amount of voltage drop at the respective contact points (0) to (m−1) as seen from the reference power supply terminal. In this case, as for the amount of the voltage drop as seen from the reference power supply terminal, a relation of the contact point (0)>the contact point (1)>the contact point (2) . . . >the contact point (m−1) will hold, so that there occurs a relative error between current values weighted with the respective unit current sources RQ(1) to RQ(m). Accordingly, linearity in analog output cannot be gained, so that it is not possible to attain the output accuracy as required.

Now, representative embodiments of the invention are described hereunder. In accordance with one aspect of the invention, there is provided a semiconductor device comprising plural unit current sources, and switches for controlling output/non-output of current from each of the plural unit current source, in which the plural unit current sources are each composed of plural unit current source elements undergoing concurrent and parallel operations in optional parallel numbers under independent control by each of the switches, and the plural unit current source elements undergoing the parallel operations are disposed so as to be spread out at equal intervals distancewise in a current source laid-out region while the switches are disposed in a distancewise concentrated manner within another region separated from the current source laid-out region.

Further, the invention provides in its another aspect a semiconductor device comprising a current source dispersedly laid-out region including plural unit current sources, and a switch concentratedly laid-out region electrically continuous with the plural unit current sources, and physically separated from the current source dispersedly laid-out region, in which the switch concentratedly laid-out region includes plural unit current source switches for controlling the plural unit current sources, respectively, the plural unit current source switches each are configured so as to control plural current source elements connected in parallel in optional numbers, the plural current source elements constituting each of the plural unit current sources, and two pieces of the current source elements disposed so as to be adjacent to each other within the current source dispersedly laid-out region are configured so as to be controlled by two different pieces of the unit current source switches among the plural unit current source switches, respectively.

With the semiconductor device according to the present invention, high precision output and high speed operation can be concurrently attained.

DETAILED DESCRIPTION OF THE PREFERRED EMBODIMENTS

Figure 1:
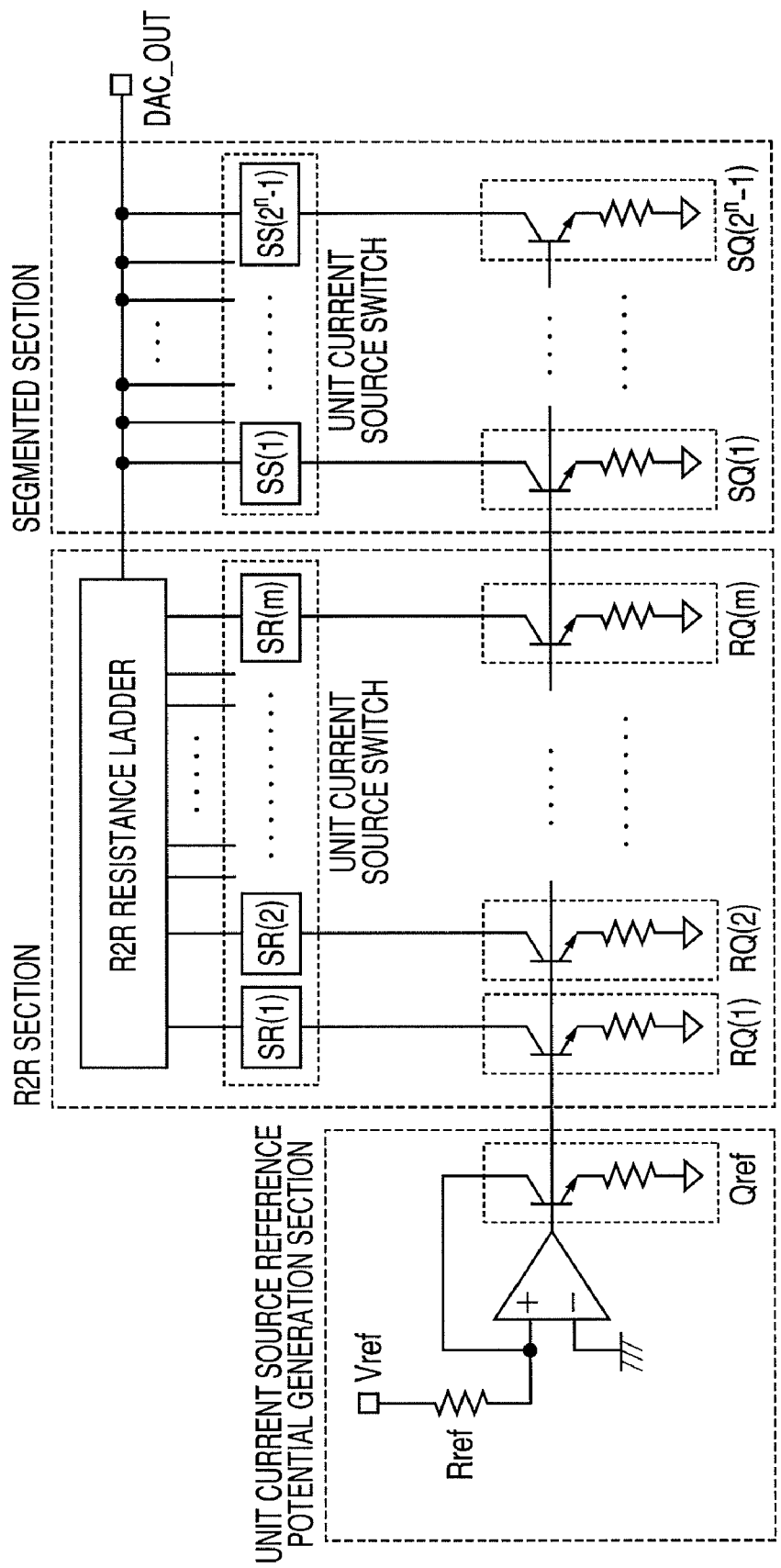
FIG. 1 is a block diagram showing a segmented R2R type D-A converter.
Figure 2:
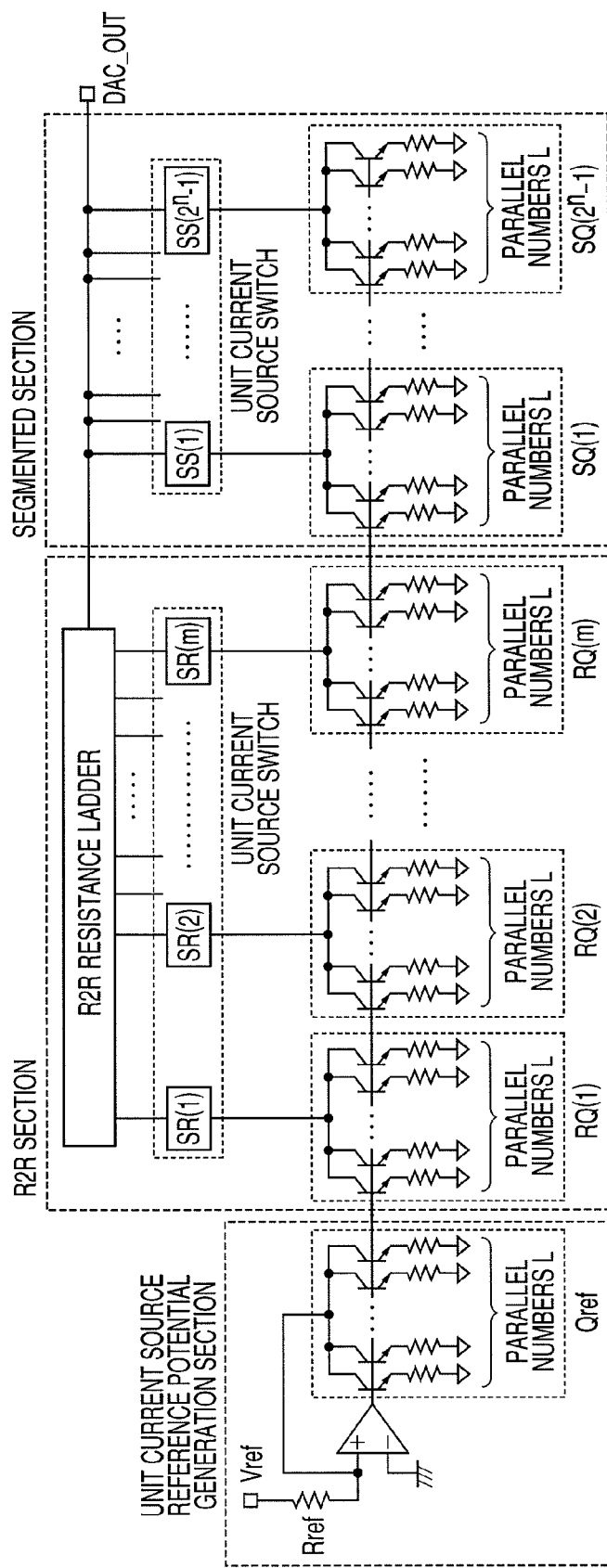
FIG. 2 is a block diagram showing unit current sources in FIG. 1, each being composed of plural current source elements undergoing parallel operations.
Figure 3:
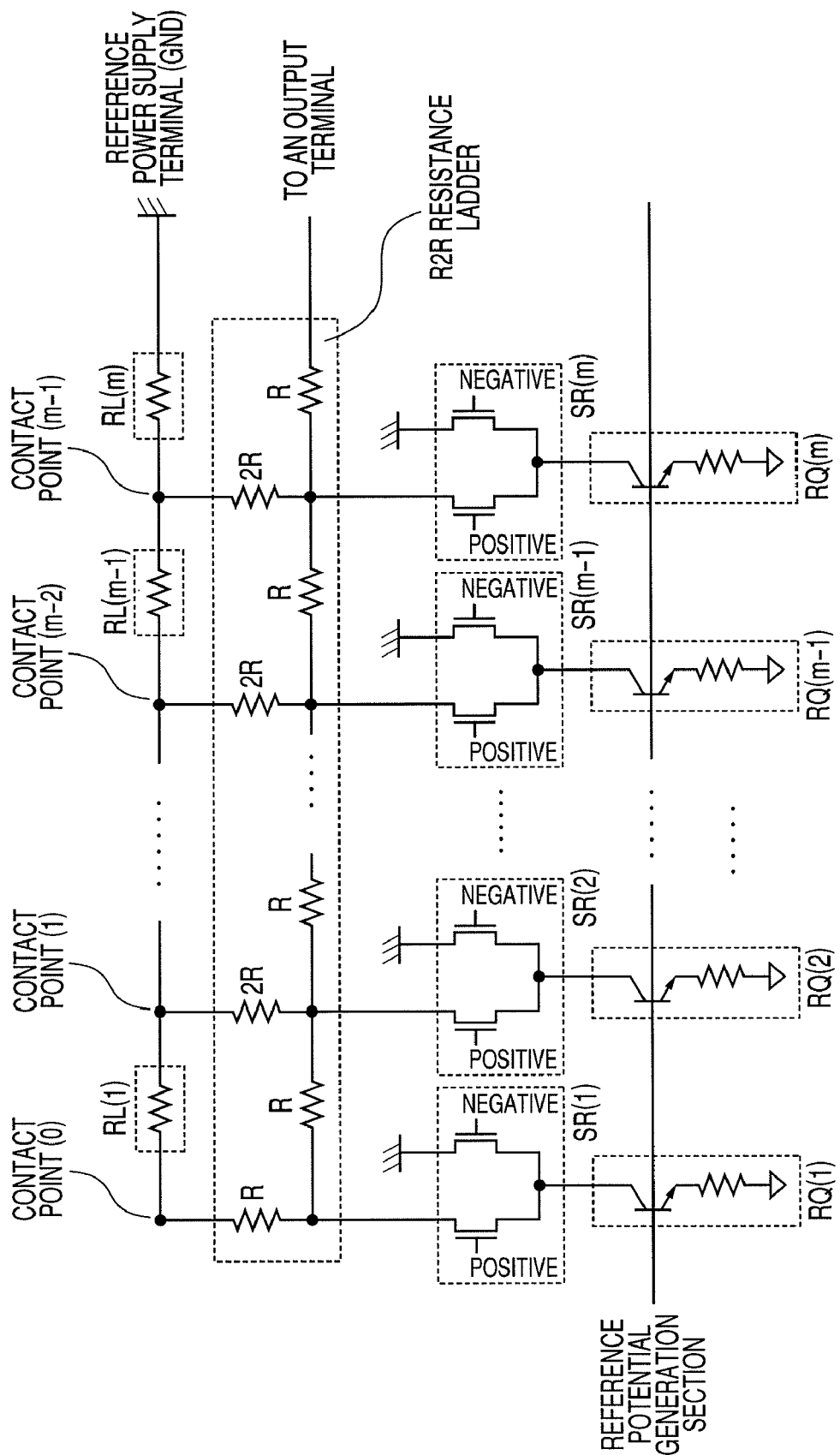
FIG. 3 is a block diagram showing a general configuration of an R2R section shown in FIG. 1.
Figure 4:
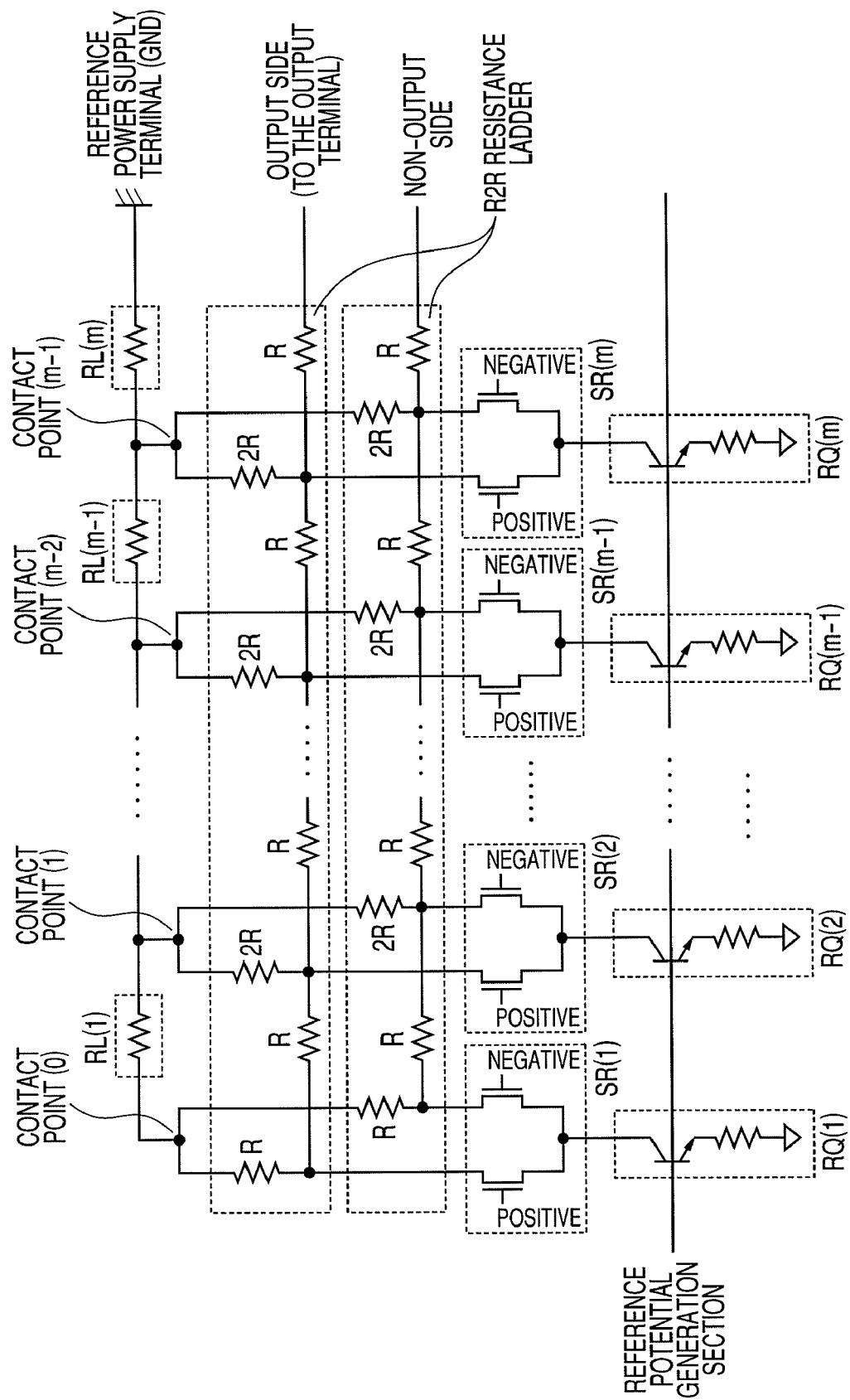
FIG. 4 is a block diagram showing a configuration of the R2R section shown in FIG. 3, in which the R2R resistance ladder is provided on the negative side of each of the unit current source switches, as well, and further, wiring for connection with a reference power supply terminal is shared by the respective R2R resistance ladders provided on the positive side, and the negative side of each of the unit current source switches.

With the present invention, means for solving the problems described as above are described hereinafter.

In order to reduce a random relative error between unit current sources, due to production tolerance, the unit current sources are each composed of plural current source elements that undergo parallel operations, and in addition, the plural current source elements (=one unit current source) that undergo parallel operations are disposed so as to be evenly spread out distancewise in a current source laid-out region, thereby reducing a relative error between the unit current sources, attributable to a characteristic error of the current source element, proportional to distance. On the other hand, unit current source switches, for controlling the unit current sources, respectively, are disposed in a locally concentrated manner within a small region separated from the current source laid-out region, each of the unit current source switches being composed of the plural current source elements that undergo parallel operations, thereby preventing wirings connecting the respective unit current source switches to an output terminal from being extended across a wide range. Further, a concentratedly laid-out region of the unit current source switches is preferably positioned in the vicinity of the output terminal. Still further, the respective unit current source switches are connected to the respective unit current sources corresponding to the former via a voltage clamp device, for example, a bipolar transistor with a base potential biased at a given potential, thereby minimizing an effect of wiring capacitance between the unit current source switch, and the unit current source, on a switching operation.

Furthermore, in an R2R resistance ladder circuit, a series of R2R resistance ladder is provided on the positive side of each of the unit current source switches, connected to an output terminal, and the negative side thereof, that is, on the side of each of the unit current source switches, unconnected to the output terminal, such that those R2R resistance ladders are symmetrical with each other, and in addition, ends of 2R resistances (the terminal end of the ladder is R resistance) connected to the positive side, and the negative side of each of the unit current source switches, respectively, are connected together at a node, whereupon wirings between the respective nodes and a reference power supply terminal are rendered independent from each other, and the respective wirings that are independent from each other are rendered identical in length. By so doing, variation in an amount of voltage drop, dependent on a distance from the node to the reference power supply terminal, is eliminated. Thus, if the R2R resistance ladder circuit according to the invention is adopted, it is possible to nearly completely cancel out a nonlinearity error attributable to wiring parasitic resistance.

Embodiments of the invention are described in detail hereinafter with reference to the accompanying drawings.

First Embodiment

Figure 5:
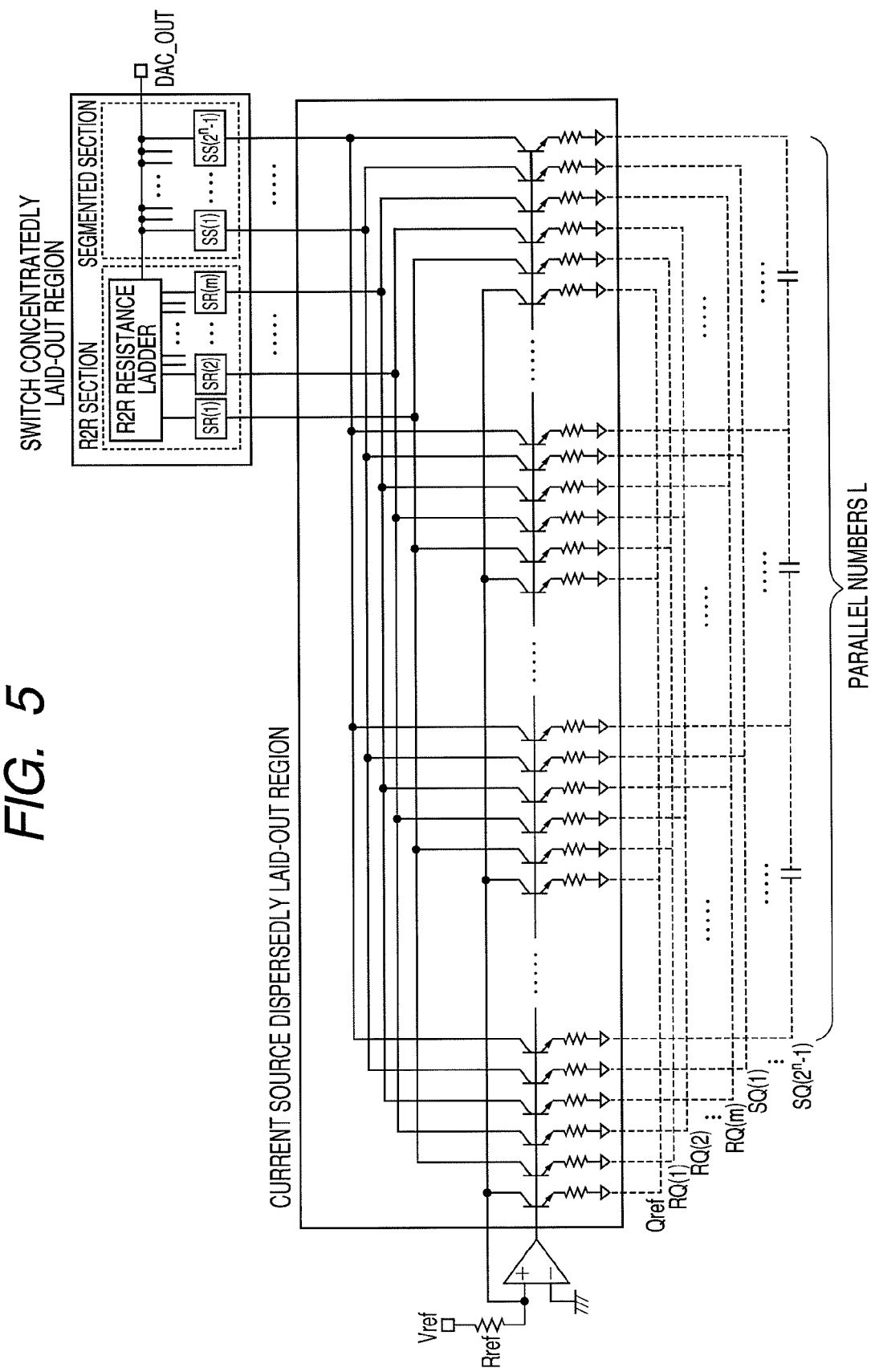
FIG. 5 is a block diagram of a segmented R2R type D-A converter to which the present invention is applied, showing a configuration in which unit current source switches of both a segmented section thereof, and an R2R section thereof are concentratedly disposed while the unit current sources are disposed so as to be evenly spread out distancewise in a current source dispersedly laid-out region, the unit current sources each being composed of the plural current source elements.

FIG. 5 is a block diagram showing an example of a configuration of a segmented R2R type D-A converter according to a first embodiment of the invention. In the case of the present D-A converter, with respect to not only unit current sources $SQ(1)$ to $SQ(2^n-1)$ of a segmented section thereof, but also unit current sources $RQ(1)$ to $RQ(m)$ of an R2R section thereof, the unit current sources are disposed so as to be evenly spread out distancewise in a current source dispersedly laid-out region, the unit current sources each being composed of plural current source elements arranged in parallel numbers L. Since the respective unit current sources $SQ(1)$ to $SQ(2^n-1)$ and $RQ(1)$ to $RQ(m)$ are composed of the plural current source elements undergoing parallel operations (the parallel numbers L), a random relative error attributable to production tolerance is reduced to $1/\sqrt{L}$, and since the plural current source elements undergoing parallel operations in the parallel numbers L are disposed so as to be evenly spread out distancewise in the current source dispersedly laid-out region on a unit current source-by-unit current source basis, a relative error between the unit current sources, attributable to the characteristic error of the current source element, proportional to distance, is reduced.

Further, at the same time, a reference current source Qref for generating a reference potential in order to bias a base potential of each the unit current sources $SQ(1)$ to $SQ(2^n-1)$, and $RQ(1)$ to $RQ(m)$ to a given potential is also composed of plural current source elements undergoing parallel operations in the parallel numbers L, the current source elements being disposed so as to be evenly spread out distancewise in the current source dispersedly laid-out region. On the other hand, unit current source switches $SS(1)$ to $SS(2^n-1)$ of a segmented section, and unit current source switches $SR(1)$ to $SR(m)$ of an R2R section, corresponding to the unit current sources $SQ(1)$ to $SQ(2^n-1)$ and the unit current sources $RQ(1)$ to $RQ(m)$, dispersedly disposed in the current source dispersedly laid-out region, respectively, are disposed in a concentrated manner within a switch concentratedly laid-out region, thereby mitigating delay in switching operation, due to wiring extended over a long distance. Vref means a reference voltage; Rref means a reference resistance; and DAC_OUT means an output terminal.

Second Embodiment

Figure 6:
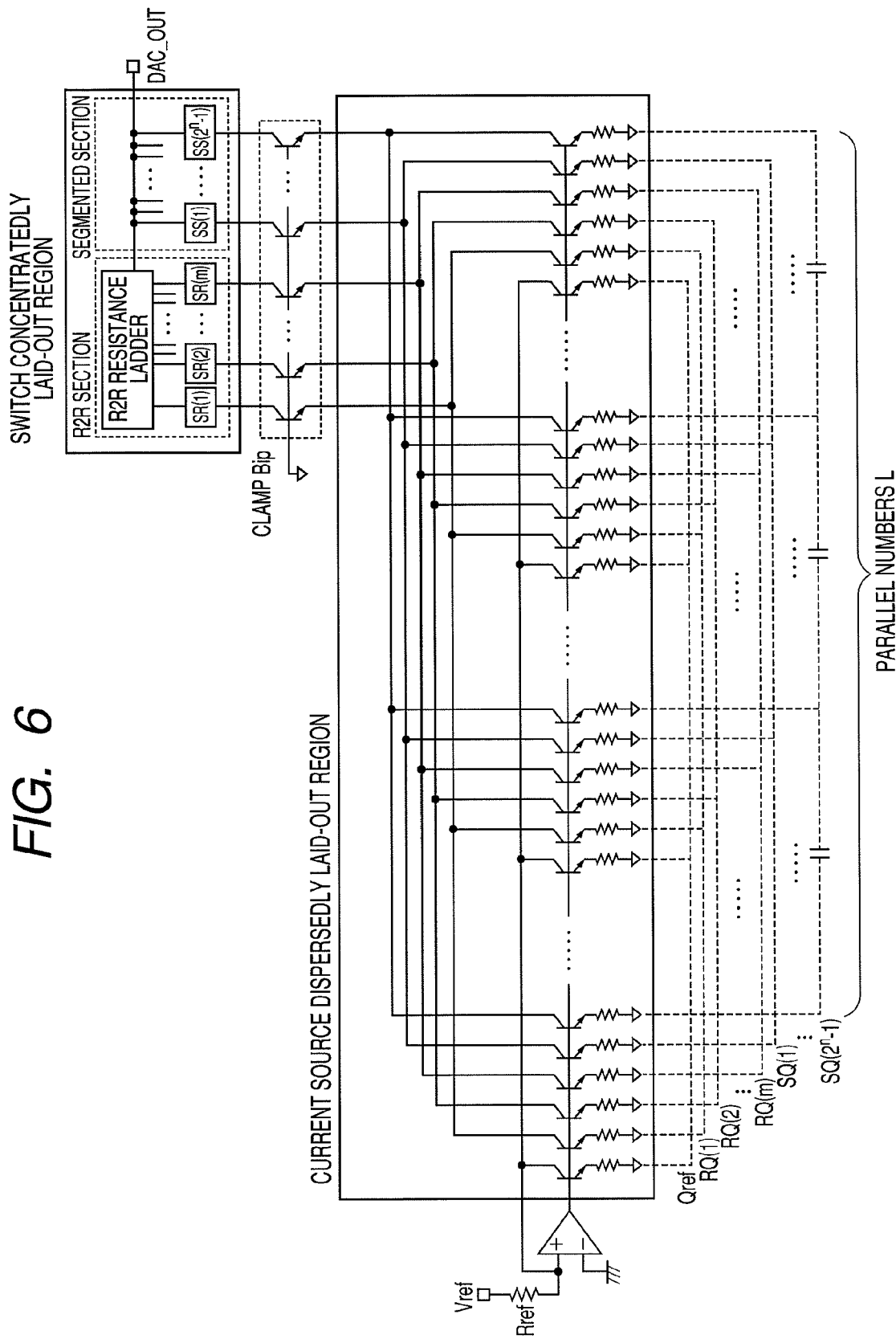
FIG. 6 is a block diagram showing another example of a configuration of the segmented R2R type D-A converter in FIG. 5, in which a voltage clamp device is installed between the respective unit current source switches and the respective the unit current sources.

FIG. 6 is a block diagram showing another example of a configuration of a segmented R2R type D-A converter according to a second embodiment of the invention. As shown in FIG. 6, unit current source switches $SS(1)$ to $SS(2^n-1)$ of a segmented section, and unit current source switches $SR(1)$ to $SR(m)$ of an R2R section, disposed in a concentrated manner within a switch concentratedly laid-out region are each connected to the collector of an NPN bipolar transistor with a base potential biased at a given potential, and the emitter of each of the NPN bipolar transistors is connected to the connector of each of unit current sources SQ(1) to SQ(2"−1) of a segmented section and the unit current sources RQ(1) to RQ(m) of an R2R section, corresponding to the unit current source switches SS(1) to SS(2"−1), and the unit current source switches SR(1) to SR(m), respectively. By doing so, it is possible to check delay in switching operation, attributable to wiring capacitance of a connector node of each of the unit current sources because wiring of the connector node is extended over a long distance since the unit current sources are dispersedly disposed. Vref means a reference voltage; Rref means a reference resistance; and DAC_OUT means an output terminal.

Figure 7:
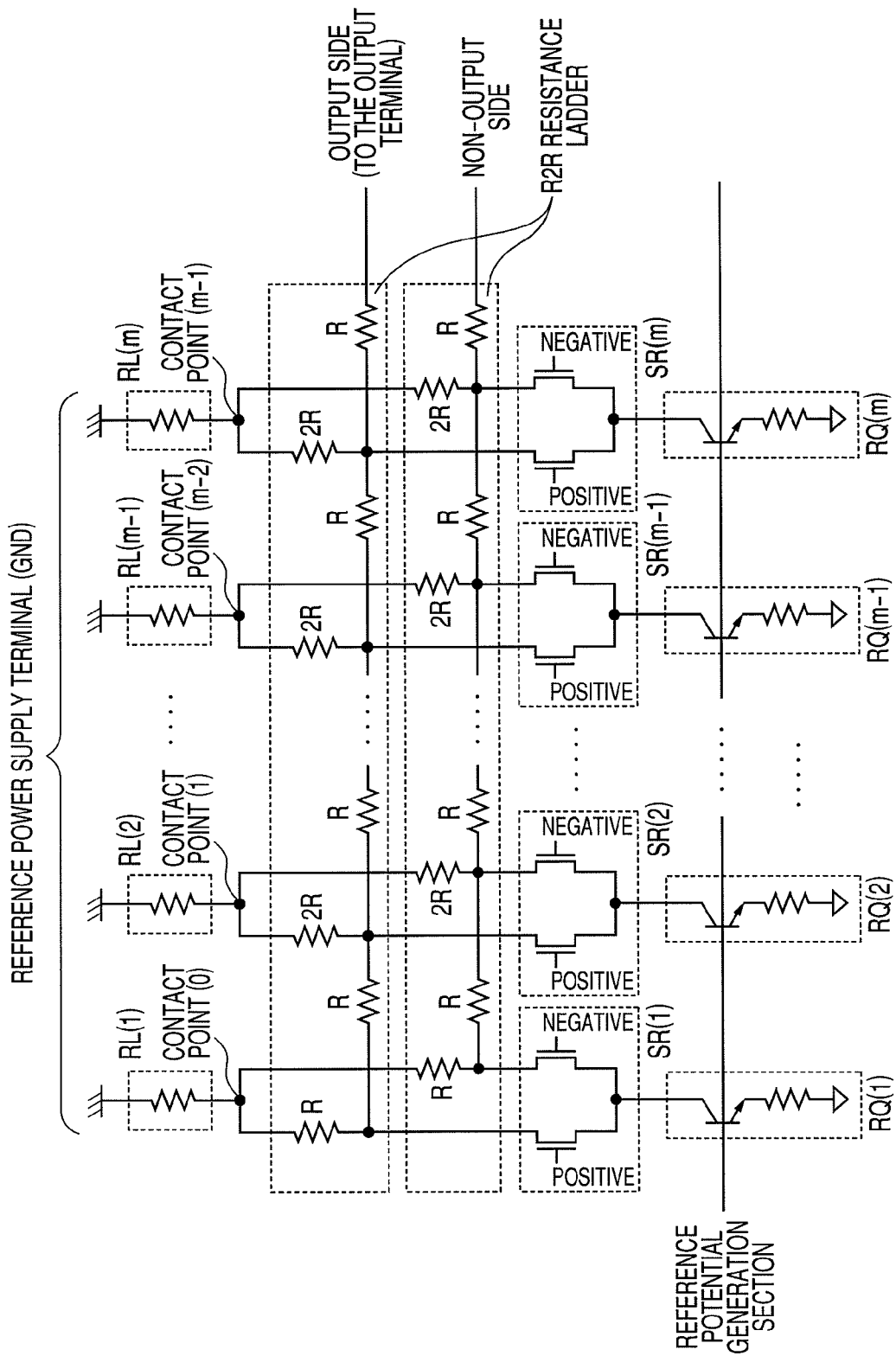
FIG. 7 is a block diagram showing in detail the R2R section to which the invention shown in FIGS. 5, and 6 are applied.

FIG. 7 is a block diagram showing in detail the R2R section of the embodiments of the invention, shown in FIGS. 5, and 6, respectively. A configuration of FIG. 7 has the following feature. First, a series of R2R resistance ladder is connected with the positive side of each of the unit current source switches SR(1) to SR(m) connected to the unit current sources RQ(1) to RQ(m), respectively, that is, the side thereof, connected to an output terminal, and the negative side thereof, that is, the side thereof, unconnected to the output terminal, respectively, and in the R2R resistance ladders provided on the positive side, and the negative side, respectively, so as to be symmetrical with each other, the ends of 2R resistances (the terminal end of the ladder is R resistance) connected to the positive side, and the negative side of each of the unit current source switches SR(1) to SR(m), respectively, are shorted at respective contact points (0) to (m−1) before being connected to a reference power supply terminal (GND) via an independent wiring, respectively. Further, respective wirings between the contact points (0) to (m−1) and the reference power supply terminal (GND) are rendered identical in length.

Since the respective wirings between the contact points (0) to (m−1) and the reference power supply terminal (GND) are identical in length, wiring parasitic resistances RL(1) to RL(m) between the respective contact points (0) to (m−1) and the reference power supply terminal (GND) are uniform. Accordingly, respective amounts of voltage drops from the reference power supply terminal (GND, occurring to the respective contact points (0) to (m−1), are identical, so that a nonlinearity error attributable to wiring resistance RL(1) to RL(m) will not result. Thus, if the configuration described as above is applied to the R2R section, this will enable the nonlinearity error attributable to the wiring resistance to be nearly completely cancelled out.

What is claimed is:

1. A semiconductor device comprising:
a plurality of unit current sources; and
switches for controlling output/non-output of current from each of the plurality of the unit current sources,
wherein the plurality of the unit current sources are each composed of a plurality of current source elements undergoing concurrent and parallel operations in optional parallel numbers under independent control by each of the switches, and
wherein the plurality of the current source elements undergoing the parallel operations are disposed so as to be spread out at equal intervals distancewise in a current source laid-out region while the switches are disposed in a distancewise concentrated manner within another region separated from the current source laid-out region.

2. The semiconductor device according to claim 1, wherein the switches each are connected to the plurality of the unit current sources via each of voltage clamp devices disposed in the vicinity of a switch concentratedly laid-out region, or in the switch concentratedly laid-out region.

3. A semiconductor device comprising:
a current source dispersedly laid-out region including a plurality of unit current sources; and
a switch concentratedly laid-out region electrically connected with the plurality of the unit current sources, and physically separated from the current source dispersedly laid-out region,
wherein the switch concentratedly laid-out region includes a plurality of unit current source switches for controlling the plurality of the unit current sources, respectively,
wherein the plurality of the unit current source switches each are configured so as to control a plurality of current source elements connected in parallel in optional numbers,
wherein the plurality of the current source elements constituting each of the plurality of the unit current sources, and
wherein two pieces of the current source elements disposed so as to be adjacent to each other within the current source dispersedly laid-out region are configured so as to be controlled by two different pieces of the unit current source switches among the plurality of the unit current source switches, respectively.

4. The semiconductor device according to claim 3, wherein the plurality of the current source elements connected in parallel in the optional numbers, constituting each of the plurality of the unit current sources, undergo operations in parallel with each other.

5. The semiconductor device according to claim 4, wherein the plurality of the current source elements undergoing parallel operations in the optional parallel numbers, constituting one of the unit current source to be controlled by one of the unit current source switch among the plurality of the unit current source switches, are disposed so as to be distancewise dispersed from each other in the current source dispersedly laid-out region.

6. The semiconductor device according to claim 5, further comprising:
reference current sources for generating a reference potential for biasing a base potential of each of the plurality of the unit current sources to a given potential,
wherein the reference current sources each are composed of a plurality of unit current source elements undergoing parallel operations in optional parallel numbers, and the reference current sources, together with the plurality of the current source elements constituting each of the plurality of the unit current sources, are disposed so as to be dispersed in the current source dispersedly laid-out region.

7. The semiconductor device according to claim 6, wherein the plurality of the unit current source switches for controlling output/non-output of each of the plurality of the unit current source that are dispersedly disposed in the current source dispersedly laid-out region are disposed in a distancewise concentrated manner within the switch concentratedly laid-out region.

8. The semiconductor device according to claim 3, wherein the switch concentratedly laid-out region includes an R2R section having an R2R ladders and a first switch group among the plurality of the unit current source switches, and a segmented section including a second switch group among the plurality of the unit current source switches, different from the first switch group, and wherein a series of R2R ladders is connected to the positive side and the negative side of each of the unit current source switches constituting the first switch group, respectively, while with the respective R2R ladders provided on the positive side, and on the negative, so as to be symmetrical with each other, 2R resistances positioned on the positive side, and the negative side of each of the unit current source switches, respectively, are shorted with each other at a contact point before being connected to a reference power supply terminal, and wirings connecting the respective contact points to the reference power supply terminal, corresponding to the respective unit current source switches, are identical in length to each other.

9. The semiconductor device according to claim 8, wherein the plurality of the current source elements connected in parallel in the optional numbers, constituting each of the plurality of the unit current sources, undergo operations in parallel with each other.

10. The semiconductor device according to claim 9, wherein the plurality of the current source elements undergoing parallel operations in the optional parallel numbers, constituting one of the unit current sources to be controlled by one unit current source switch among the plurality of the unit current source switches, are disposed so as to be distancewise dispersed from each other in the current source dispersedly laid-out region.

11. The semiconductor device according to claim 10, further comprising:

reference current sources for generating a reference potential for biasing a base potential of each of the plurality of the unit current sources to a given potential, wherein the reference current sources each are composed of a plurality of unit current source elements undergoing parallel operations in optional parallel numbers, and wherein the reference current sources, together with the plurality of the current source elements constituting each of the plurality of the unit current sources, are disposed so as to be dispersed in the current source dispersedly laid-out region.

12. The semiconductor device according to claim 11, wherein the plurality of the unit current source switches for controlling output/non-output of each of the plurality of the unit current sources that are dispersedly disposed in the current source dispersedly laid-out region are disposed in a distancewise concentrated manner within the switch concentratedly laid-out region.

13. A semiconductor device comprising:

a plurality of unit current sources;

switches for controlling output/non-output of current from each of the plurality of the unit current sources; and a series of R2R resistance ladders provided on the positive side and the negative side of each of the switches, respectively, wherein a power-supply connection-side resistance (2R resistance) of the R2R resistance ladder, added to the positive side of each of the switches, and a power-supply connection-side resistance (2R resistance) of the R2R resistance ladder, added to the negative side of each of the switches, are connected with each other at respective nodes, and connections between the respective nodes, and power supply terminals have an equal wiring resistance.

14. The semiconductor device according to claim 13, wherein the switches each are connected to the plurality of the unit current sources via each of voltage clamp devices disposed in the vicinity of a switch concentratedly laid-out region, or in the switch concentratedly laid-out region.

* * * * *